(12) United States Patent
Moseley

(10) Patent No.: US 11,012,069 B2
(45) Date of Patent: May 18, 2021

(54) KEYBOARD KEY WITH CAPACITIVE SWITCH HAVING MECHANICAL AND PROXIMITY SWITCHING FUNCTIONS

(71) Applicant: Tactual Labs Co., New York, NY (US)

(72) Inventor: Braon Moseley, Round Rock, TX (US)

(73) Assignee: Tactual Labs Co., New York, NY (US)

( * ) Notice: Subject to any disclaimer, the term of this patent is extended or adjusted under 35 U.S.C. 154(b) by 0 days.

(21) Appl. No.: 16/384,050

(22) Filed: Apr. 15, 2019

(65) Prior Publication Data

US 2019/0319620 A1 Oct. 17, 2019

Related U.S. Application Data

(60) Provisional application No. 62/657,160, filed on Apr. 13, 2018.

(51) Int. Cl.
| | |
|---|---|
| G06F 3/023 | (2006.01) |
| G06F 3/044 | (2006.01) |
| H03K 17/955 | (2006.01) |
| H03K 17/965 | (2006.01) |
| G06F 3/02 | (2006.01) |
| H01H 13/14 | (2006.01) |
| H01H 13/20 | (2006.01) |
| H01H 13/70 | (2006.01) |
| H03K 17/96 | (2006.01) |
| G06F 3/047 | (2006.01) |
| H03K 17/967 | (2006.01) |
| H03K 17/945 | (2006.01) |

(52) U.S. Cl.
CPC ............. *H03K 17/955* (2013.01); *G06F 3/02* (2013.01); *G06F 3/0202* (2013.01); *G06F 3/023* (2013.01); *G06F 3/044* (2013.01); *G06F 3/047* (2013.01); *H01H 13/14* (2013.01); *H01H 13/20* (2013.01); *H01H 13/70* (2013.01); *H03K 17/965* (2013.01); *H03K 17/967* (2013.01); *H03K 17/9622* (2013.01); *H01H 2233/07* (2013.01); *H03K 2017/9455* (2013.01)

(58) Field of Classification Search
CPC .......... G06F 3/0202; G06F 3/01; G06F 3/016; G06F 3/02; G06F 3/0219; G06F 3/044; G06F 3/047; H03K 17/962; H03K 17/9622; H03K 17/965; H03K 17/967; H03K 17/98; H03K 2217/94094; H01H 13/20

See application file for complete search history.

(56) References Cited

U.S. PATENT DOCUMENTS

| | | | | |
|---|---|---|---|---|
| 9,041,652 | B2* | 5/2015 | Elias | G06F 3/044 341/22 |
| 9,368,300 | B2* | 6/2016 | Casparian | H01H 13/83 |
| 9,933,880 | B2* | 4/2018 | Leigh | G06F 3/0442 |

* cited by examiner

Primary Examiner — Vanessa Girardi
(74) Attorney, Agent, or Firm — Adam Landa

(57) ABSTRACT

A key switch implements a receiving switch conductor and transmitting switch conductor in the key switch. Depressing the key switch will cause the receiving switch conductor and transmitting switch conductor to approach each other. The approach of a finger and movement of the key switch can be detected using the receiving switch conductor and the transmitting switch conductor.

14 Claims, 6 Drawing Sheets

KEYBOARD KEY WITH CAPACITIVE SWITCH HAVING MECHANICAL AND PROXIMITY SWITCHING FUNCTIONS

This Application claims the benefit of U.S. Provisional Patent Application Ser. No. 62/657,160, filed Apr. 13, 2018, the contents of which are hereby incorporated by reference. This application includes material which is subject to copyright protection. The copyright owner has no objection to the facsimile reproduction by anyone of the patent disclosure, as it appears in the Patent and Trademark Office files or records, but otherwise reserves all copyright rights whatsoever.

FIELD

The disclosed systems relate in general to the field of user input, and in particular to keyboards.

BRIEF DESCRIPTION OF THE DRAWINGS

The foregoing and other objects, features, and advantages of the disclosure will be apparent from the following more particular description of embodiments as illustrated in the accompanying drawings in which reference characters refer to the same parts throughout the various views. The drawings are not necessarily to scale, emphasis instead being placed upon illustrating principles of the disclosed embodiments.

DETAILED DESCRIPTION

Figure 1:
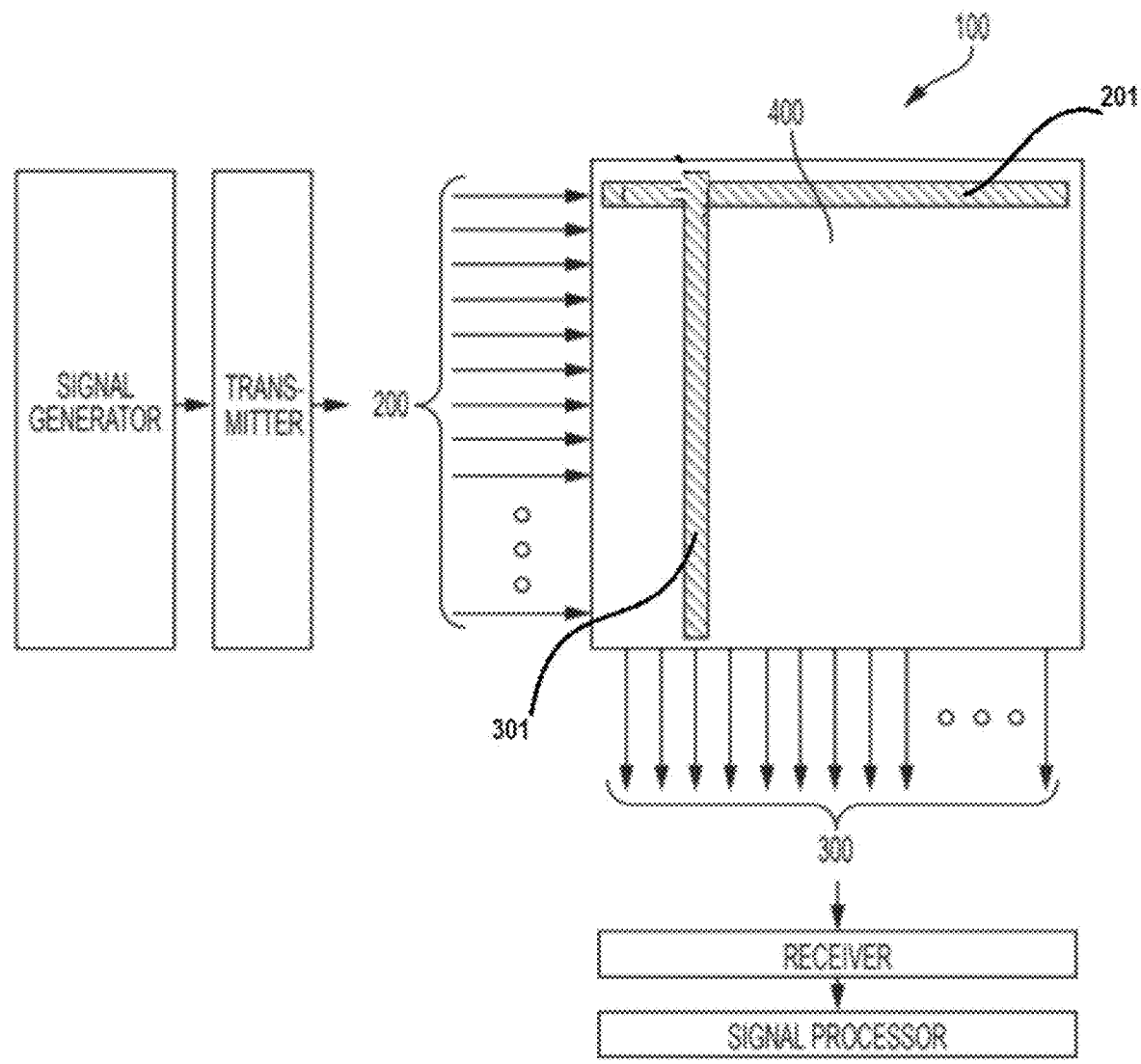
FIG. 1 is a high level block diagram illustrating an embodiment of a low-latency touch sensor device.

In various embodiments, the present disclosure is directed to systems (e.g., objects, panels or keyboards) sensitive to hover, contact and pressure and their applications in real-world, artificial reality, virtual reality and augmented reality settings. It will be understood by one of ordinary skill in the art that the disclosures herein apply generally to all types of systems using fast multi-touch to detect hover, contact and pressure. In an embodiment, the present system and method can be applied to keyboards, including but not limited to membrane keyboards, dome-switch keyboards, scissor-switch keyboards, capacitive keyboards, mechanical-switch keyboards, buckling-spring keyboards, hall-effect keyboards, laser projection keyboards, roll-up keyboards and optical keyboard technology.

Throughout this disclosure, the terms "touch", "touches", "touch event", "contact", "contacts", "hover", or "hovers" or other descriptors may be used to describe events or periods of time in which a key, key switch, user's finger, a stylus, an object, or a body part is detected by a sensor. In some sensors, detections occur only when the user is in physical contact with a sensor, or a device in which it is embodied. In some embodiments, and as generally denoted by the word "contact", these detections occur as a result of physical contact with a sensor, or a device in which it is embodied. In other embodiments, and as sometimes generally referred to by the term "hover", the sensor may be tuned to allow for the detection of "touches" that are hovering at a distance above the touch surface or otherwise separated from the sensor device and causes a recognizable change, despite the fact that the conductive or capacitive object, e.g., a finger, is not in actual physical contact with the surface. Therefore, the use of language within this description that implies reliance upon sensed physical contact should not be taken to mean that the techniques described apply only to those embodiments; indeed, nearly all, if not all, of what is described herein would apply equally to "contact" and "hover", each of which is a "touch". Generally, as used herein, the word "hover" refers to non-contact touch events or touch, and as used herein the term "hover" is one type of "touch" in the sense that "touch" is intended herein. Thus, as used herein, the phrase "touch event" and the word "touch" when used as a noun include a near touch and a near touch event, or any other gesture that can be identified using a sensor. "Pressure" refers to the force per unit area exerted by a user contact (e.g., presses by their fingers or hand) against the surface of an object. The amount of "pressure" is similarly a measure of "contact", i.e., "touch". "Touch" refers to the states of "hover", "contact", "pressure", or "grip", whereas a lack of "touch" is generally identified by signals being below a threshold for accurate measurement by the sensor. In accordance with an embodiment, touch events may be detected, processed, and supplied to downstream computational processes with very low latency, e.g., on the order of ten milliseconds or less, or on the order of less than one millisecond.

As used herein, and especially within the claims, ordinal terms such as first and second are not intended, in and of themselves, to imply sequence, time or uniqueness, but rather, are used to distinguish one claimed construct from another. In some uses where the context dictates, these terms may imply that the first and second are unique. For example, where an event occurs at a first time, and another event occurs at a second time, there is no intended implication that the first time occurs before the second time, after the second time or simultaneously with the second time. However, where the further limitation that the second time is after the first time is presented in the claim, the context would require reading the first time and the second time to be unique times. Similarly, where the context so dictates or permits, ordinal terms are intended to be broadly construed so that the two identified claim constructs can be of the same characteristic or of different characteristic. Thus, for example, a first and a second frequency, absent further limitation, could be the same frequency, e.g., the first frequency being 10 Mhz and the second frequency being 10 Mhz; or could be different frequencies, e.g., the first frequency being 10 Mhz and the second frequency being 11 Mhz. Context may dictate otherwise, for example, where a first and a second frequency are further limited to being frequency-orthogonal to each other, in which case, they could not be the same frequency.

The presently disclosed systems and methods provide for designing, manufacturing and using capacitive sensors, and particularly capacitive sensors that employ a multiplexing scheme based on orthogonal signaling such as but not limited to frequency-division multiplexing (FDM), code-division multiplexing (CDM), or a hybrid modulation technique that combines both FDM and CDM methods. References to frequency herein could also refer to other orthogonal signal bases. As such, this application incorporates by reference Applicants' prior U.S. Pat. No. 9,019,224, entitled "Low-Latency Touch Sensitive Device" and U.S. Pat. No. 9,158,411 entitled "Fast Multi-Touch Post Processing." These applications contemplate FDM, CDM, or FDM/CDM hybrid touch sensors which may be used in connection with the presently disclosed sensors. In such sensors, interactions are sensed when a signal from a row is coupled (increased) or decoupled (decreased) to a column and the result received on that column. By sequentially exciting the rows and measuring the coupling of the excitation signal at the columns, a heatmap reflecting capacitance changes, and thus proximity, can be created.

This application also employs principles used in fast multi-touch sensors and other interfaces disclosed in the following: U.S. Pat. Nos. 9,933,880; 9,019,224; 9,811,214; 9,804,721; 9,710,113; and 9,158,411.Familiarity with the disclosure, concepts and nomenclature within these patents is presumed. The entire disclosures of those patents and the applications incorporated therein by reference are incorporated herein by reference. This application also employs principles used in fast multi-touch sensors and other interfaces disclosed in the following: U.S. patent application Ser. Nos. 15/162,240; 15/690,234; 15/195,675; 15/200,642; 15/821,677; 15/904,953; 15/905,465; 15/943,221; 62/540,458, 62/575,005, 62/621,117, 62/619,656 and PCT publication PCT/US2017/050547, familiarity with the disclosures, concepts and nomenclature therein is presumed. The entire disclosure of those applications and the applications incorporated therein by reference are incorporated herein by reference.

In an embodiment, a fast multi-touch sensor utilizes a projected capacitive method that has been enhanced for high update rate and low latency measurements of touch events. The technique can use parallel hardware and higher frequency waveforms to gain the above advantages. Also disclosed are methods to make sensitive and robust measurements. These methods may be used on transparent display surfaces and may permit economical manufacturing of products which employ the technique. In this regard, a "capacitive object" as used herein could be a finger, another part of the human body, keyboard, a stylus, or any object to which the sensor is sensitive. The sensors and methods disclosed herein need not rely on capacitance. With respect to, e.g., an optical sensor, such embodiments utilize photon tunneling and leaking to sense a touch event, and a "capacitive object" as used herein includes any object, such as a stylus or finger, that that is compatible with such sensing. Similarly, "touch locations" and "touch sensitive device" as used herein do not require actual touching contact between a capacitive object and the disclosed sensor.

FIG. 1 illustrates certain principles of a fast multi-touch sensor 100 in accordance with an embodiment. At 200, a different signal is transmitted into each of the row conductors 201 of the touch surface 400. The signals are designed to be "orthogonal", i.e., separable and distinguishable from each other. At 300, a receiver is attached to each column conductor 301. The row conductors 201 and the column conductors 301 are conductors/antennas that are able to transmit and/or receive signals. The receiver is designed to receive any of the transmitted signals, or an arbitrary combination of them, with or without other signals and/or noise, and to individually determine a measure, e.g., a quantity for each of the orthogonal transmitted signals present on that column conductor 301. The touch surface 400 of the sensor comprises a series of row conductors 201 and column conductors 301 (not all shown), along which the orthogonal signals can propagate. In an embodiment, the row conductors 201 and column conductors 301 are arranged such that a touch event will cause a change in coupling between at least one of the row conductors and at least one of the column conductors. In an embodiment, a touch event will cause a change in the amount (e.g., magnitude) of a signal transmitted on a row conductor that is detected in the column conductor. In an embodiment, a touch event will cause a change in the phase of a signal transmitted on a row conductor that is detected on a column conductor. Because the touch sensor ultimately detects touch due to a change in the coupling, it is not of specific importance, except for reasons that may otherwise be apparent to a particular embodiment, the type of change that is caused to the touch-related coupling by a touch. As discussed above, the touch, or touch event, does not require a physical touching, but rather an event that affects the coupled signal. In an embodiment the touch or touch event does not require a physical touching, but rather an event that affects the coupled signal in a repeatable or predictable manner.

With continued reference to FIG. 1, in an embodiment, generally, the result of a touch event in the proximity of both a row conductor 201 and column conductor 301 causes a change in the signal that is transmitted on a row conductor as it is detected on a column conductor. In an embodiment, the change in coupling may be detected by comparing successive measurements on the column conductor. In an embodiment, the change in coupling may be detected by comparing the characteristics of the signal transmitted on the row conductor to a measurement made on the column conductor. In an embodiment, a change in coupling may be measured by both comparing successive measurements on the column conductor and by comparing known characteristics of the signal transmitted on the row conductor to a measurement made on the column conductor. More generally, touch events cause, and thus correspond to, measurements of the signals on the column conductor 301. Because the signals on the row conductors 201 are orthogonal, multiple row signals can be coupled to a column conductor 301 and distinguished by the receiver. Likewise, the signals on each row conductor 201 can be coupled to multiple column conductors 301. For each column conductor 301 coupled to a given row conductor 201 (and regardless of how touch affects the coupling between the row and column), the signals measured on the column conductor 301 contain information that will indicate which row conductors 201 are being touched simultaneously with that column conductor 301. The magnitude or phase shift of each signal received is generally related to the amount of coupling between the column conductor 301 and the row conductor 201 carrying the corresponding signal, and thus, may indicate a distance of the touching object to the surface, an area of the surface covered by the touch and/or the pressure of the touch.

In various implementations of a touch device, physical contact with the row conductors 201 and/or column conductor 301 is unlikely or impossible as there may be a protective barrier between the row conductors 201 and/or column conductors 301 and the finger or other object of touch. Moreover, generally, the row conductors 201 and column conductors 301 themselves are not in physical contact with each other, but rather, placed in a proximity that allows signal to be coupled there-between, and that coupling changes with touch. Generally, the row-column coupling results not from actual contact between them, nor by actual contact from the finger or other object of touch, but rather, by the effect of bringing the finger (or other object) into proximity—which proximity results in a change of coupling, the effect of which is referred to herein as touch.

In an embodiment, the orientation of the row conductors and column conductors may vary as a consequence of a physical process, and the change in the orientation (e.g., movement) of the row conductors and/or column conductors with respect to one-another may cause a change in coupling. In an embodiment, the orientation of a row conductor and a column conductor may vary as a consequence of a physical process, and the range of orientation between the row conductor and column conductor includes ohmic contact, thus in some orientations within a range a row conductor and column conductor may be in physical contact, while in other orientations within the range, the row conductor and column conductor are not in physical contact and may have their coupling varied. In an embodiment, when a row conductor and column conductor are not in physical contact their coupling may be varied as a consequence of moving closer together or further apart. In an embodiment, when a row conductor and column conductor are not in physical contact their coupling may be varied as a consequence of grounding. In an embodiment, when a row conductor and column conductor are not in physical contact their coupling may be varied as a consequence of materials translated within the coupled field. In an embodiment, when a row conductor and column conductor are not in physical contact their coupling may be varied as a consequence of a changing shape of the row conductor or column conductor, or an antenna associated with the row conductor or column conductor.

The nature of the row conductors 201 and column conductors 301 is arbitrary and the particular orientation is variable. Indeed, the terms row conductor and column conductor are not intended to refer to a square grid, but rather to a set of conductors upon which signal is transmitted (rows) and a set of conductors onto which signal may be coupled (columns). (The notion that signals are transmitted on row conductors 201 and received on column conductors 301 itself is arbitrary, and signals could as easily be transmitted on conductors arbitrarily designated columns and received on conductors arbitrarily named rows, or both could arbitrarily be named something else.) Further, it is not necessary that row conductors and column conductors be in a grid. Other shapes are possible as long as a touch event will affect a row-column coupling. For example, the "rows" could be in concentric circles and the "columns" could be spokes radiating out from the center. And neither the "rows" nor the "columns" need to follow any geometric or spatial pattern, thus, for example, the keys on a keyboard could be arbitrarily connected to form rows and columns (related or unrelated to their relative positions.) Moreover, an antenna may be used as a row conductor. For example an antenna may be round or rectangular, or have substantially any shape, or a shape that changes. An antenna used as a row conductor may be oriented in proximity to one or more conductors, or one or more other antennas that act as columns. In other words, in an embodiment, an antenna may be used for signal transmission and oriented in proximity to one or more conductors, or one or more other antennas that are used to receive signals. A touch will change the coupling between the antenna used for signal transmission and the signal used to receive signals.

It is not necessary for there to be only two types signal propagation channels: instead of row conductors and column conductors, in an embodiment, channels "A", "B" and "C" may be provided, where signals transmitted on "A" could be received on "B" and "C", or, in an embodiment, signals transmitted on "A" and "B" could be received on "C". It is also possible that the signal propagation channels can alternate function, sometimes supporting transmitters and sometimes supporting receivers. It is also contemplated that the signal propagation channels can simultaneously support transmitters and receivers—provided that the signals transmitted are orthogonal, and thus separable, from the signals received. Three or more types of antenna or conductors may be used rather than just "rows" and "columns." Many alternative embodiments are possible and will be apparent to a person of skill in the art after considering this disclosure.

It is likewise not necessary for there to be only one signal transmitted on each transmitting media. In an embodiment, multiple orthogonal signals are transmitted on each row. In an embodiment, multiple orthogonal signals are transmitted on each transmit antenna.

Returning briefly to FIG. 1, as noted above, in an embodiment the touch surface 400 comprises a series of row conductors 201 and column conductors 301, along which signals can propagate. As discussed above, the row conductors 201 and column conductors 301 are oriented so that, when they are not being touched the signals are coupled differently than when they are being touched. The change in signal coupled between them may be generally proportional or inversely proportional (although not necessarily linearly proportional) to the touch such that touch is measured as a gradation, permitting distinction between more touch (i.e., closer or firmer) and less touch (i.e., farther or softer)—and even no touch.

At 300, a receiver is attached to each column conductor 301. The receiver is designed to receive the signals present on the column conductors 301, including any of the orthogonal signals, or an arbitrary combination of the orthogonal signals, and any noise or other signals present. Generally, the receiver is designed to receive a frame of signals present on the column conductors 301, and to identify the columns providing signal. A frame of signals is received during an integration period or sampling period. In an embodiment, the receiver (or a signal processor associated with the receiver data) may determine a measure associated with the quantity of each of the orthogonal transmitted signals present on that column conductor 301 during the time the frame of signals was captured. In this manner, in addition to identifying the row conductors 201 in touch with each column conductor 301, the receiver can provide additional (e.g., qualitative) information concerning the touch. In general, touch events may correspond (or inversely correspond) to the received signals on the column conductors 301. For each column conductor 301, the different signals received thereon indicate which of the corresponding row conductors 201 is being touched simultaneously with that column conductor 301. In an embodiment, the amount of coupling between the corresponding row conductor 201 and column conductor 301 may indicate e.g., the area of the surface covered by the touch, the pressure of the touch, etc. In an embodiment, a change in coupling over time between the corresponding row conductor 201 and column conductor 301 indicates a change in touch at the intersection of the two.

In an embodiment, a mixed signal integrated circuit comprises signal generator, transmitter, receiver and signal processor. In an embodiment, the mixed signal integrated circuit is adapted to generate one or more signals and send the signals to transmit antennas. In an embodiment, the mixed signal integrated circuit is adapted to generate a plurality of frequency-orthogonal signals and send the plurality of frequency-orthogonal signals to the transmit antenna. In an embodiment, the mixed signal integrated circuit is adapted to generate a plurality of frequency-orthogonal signals and send one or more of the plurality of frequency-orthogonal signals to each of a plurality of rows. In an embodiment, the frequency-orthogonal signals are in the range from DC up to about 2.5 GHz. In an embodiment, the frequency-orthogonal signals are in the range from DC up to about 1.6 MHz. In an embodiment, the frequency-orthogonal signals are in the range from 50 KHz to 200 KHz. The frequency spacing between the frequency-orthogonal signals should be greater than or equal to the reciprocal of an integration period (i.e., the sampling period).

In an embodiment, the signal processor of a mixed signal integrated circuit (or a downstream component or software) is adapted to determine at least one value representing each frequency orthogonal signal transmitted to a row. In an embodiment, the signal processor of the mixed signal integrated circuit (or a downstream component or software) performs a Fourier transform to received signals. In an embodiment, the mixed signal integrated circuit is adapted to digitize received signals. In an embodiment, the mixed signal integrated circuit (or a downstream component or software) is adapted to digitize received signals and perform a discrete Fourier transform (DFT) on the digitized information. In an embodiment, the mixed signal integrated circuit (or a downstream component or software) is adapted to digitize received signals and perform a Fast Fourier transform (FFT) on the digitized information—an FFT being one type of discrete Fourier transform.

It will be apparent to a person of skill in the art in view of this disclosure that a DFT, in essence, treats the sequence of digital samples (e.g., window) taken during a sampling period (e.g., integration period) as though it repeats. As a consequence, signals that are not center frequencies (i.e., not integer multiples of the reciprocal of the integration period (which reciprocal defines the minimum frequency spacing)), may have relatively nominal, but unintended consequence of contributing small values into other DFT bins. Thus, it will also be apparent to a person of skill in the art in view of this disclosure that the term orthogonal as used herein is not "violated" by such small contributions. In other words, as we use the term frequency orthogonal herein, two signals are considered frequency orthogonal if substantially all of the contribution of one signal to the DFT bins is made to different DFT bins than substantially all of the contribution of the other signal.

In an embodiment, received signals are sampled at least 1 MHz. In an embodiment, received signals are sampled at least 2 MHz. In an embodiment, received signals are sampled at 4 Mhz. In an embodiment, received signals are sampled at 4.096 Mhz. In an embodiment, received signals are sampled at more than 4 MHz.

To achieve kHz sampling, for example, 4096 samples may be taken at 4.096 MHz. In such an embodiment, the integration period is 1 millisecond, which per the constraint that the frequency spacing should be greater than or equal to the reciprocal of the integration period provides a minimum frequency spacing of 1 KHz. (It will be apparent to one of skill in the art in view of this disclosure that taking 4096 samples at e.g., 4 MHz would yield an integration period slightly longer than a millisecond, and not achieving kHz sampling, and a minimum frequency spacing of 976.5625 Hz.) In an embodiment, the frequency spacing is equal to the reciprocal of the integration period. In such an embodiment, the maximum frequency of a frequency-orthogonal signal range should be less than 2 MHz. In such an embodiment, the practical maximum frequency of a frequency-orthogonal signal range should be less than about 40% of the sampling rate, or about 1.6 MHz. In an embodiment, a DFT (which could be an FFT) is used to transform the digitized received signals into bins of information, each reflecting the frequency of a frequency-orthogonal signal transmitted which may have been transmitted by the transmit antenna 130. In an embodiment 2048 bins correspond to frequencies from 1 KHz to about 2 MHz. It will be apparent to a person of skill in the art in view of this disclosure that these examples are simply that, exemplary. Depending on the needs of a system, and subject to the constraints described above, the sample rate may be increased or decrease, the integration period may be adjusted, the frequency range may be adjusted, etc.

In an embodiment, a DFT (which can be an FFT) output comprises a bin for each frequency-orthogonal signal that is transmitted. In an embodiment, each DFT (which can be an FFT) bin comprises an in-phase (I) and quadrature (Q) component. In an embodiment, the sum of the squares of the I and Q components is used as measure corresponding to signal strength for that bin. In an embodiment, the square root of the sum of the squares of the I and Q components is used as measure corresponding to signal strength for that bin. It will be apparent to a person of skill in the art in view of this disclosure that a measure corresponding to the signal strength for a bin could be used as a measure related to touch. In other words, the measure corresponding to signal strength in a given bin would change as a result of a touch event.

The row conductor 201 and column conductor 301 setup shown in FIG. 1, as well as the sensing methodologies, provides the framework for the below discussion related to key switches and keyboards. The sensitivity to various touch events set forth in the row conductor 201 and column conductor 301 discussion can be applied to the improvement of key switches for keyboards. The row conductor 201 and column conductor 301 arrangement can be used to provide the substrate upon which a keyboard can be mapped and key switches can be employed. As used herein, terms such as touch events or events, can refer to actions that occur when a user interacts with a keyboard.

Figure 2:
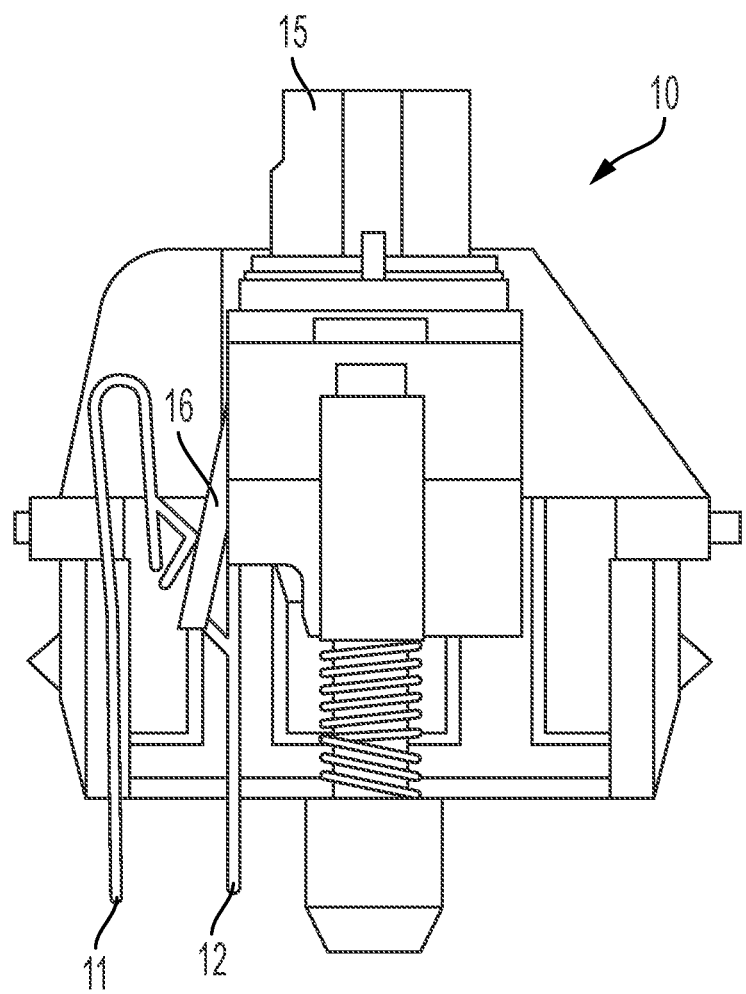
FIG. 2 shows a mechanical key switch used with keyboards.
Figure 3:
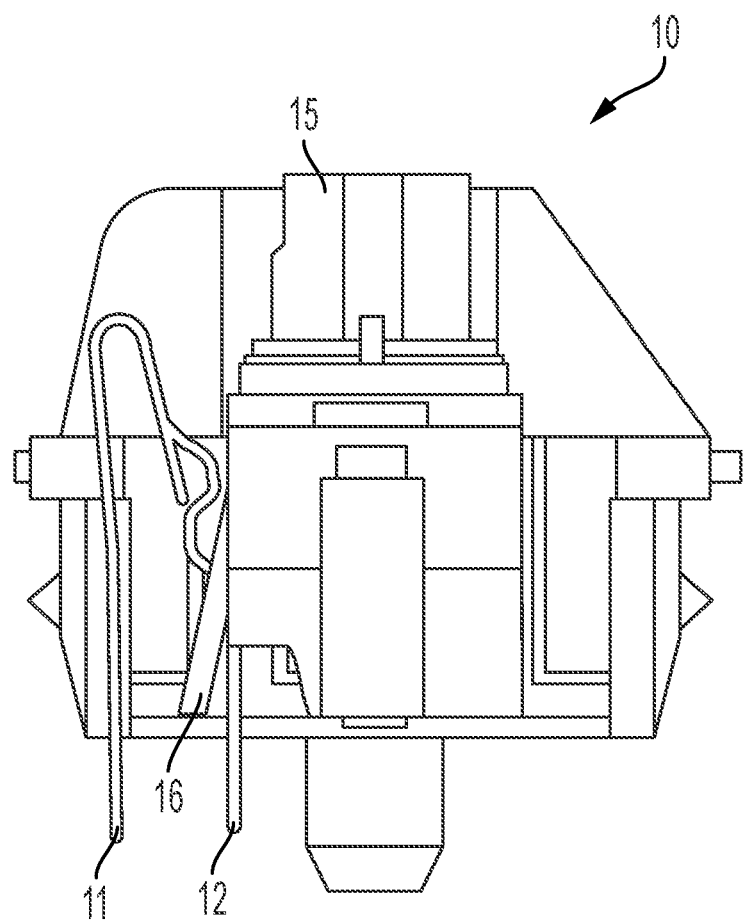
FIG. 3 shows the mechanical key switch of FIG. 2 in a depressed state.

Turning to FIGS. 2 and 3, shown is a type of key switch 10 that is commonly referred to as a Cherry MX red switch. When this type of key switch 10 is used, actuation of the key switch 10 occurs when the stem 15 slides in a manner so that as it moves downwards, the first switch portion 11 and the second switch portion 12 contact each other. When the stem 15 slides past the first switch portion 11, the stem projection 16 of the stem 15 that prevented any contact between the first switch portion 11 and the second switch portion 12 is moved. The movement of the stem projection 16 permits contact between the first switch portion 11 and the second switch portion 12 to occur. The contact that occurs between the first switch portion 11 and the second switch portion 12 occurs prior to the stem 15 reaching the fullest extent of its depression. When using the key switch 10 shown in FIGS. 2 and 3 the contact between the first switch portion 11 and the second switch portion 12 completes a circuit and will register as a struck key.

The key switch 10 permits quick responses during typing or gaming activity. This type of key switch 10 may be mounted on plates or printed circuit boards (PCBs) that are used for keyboards. Typically a plurality of key switches 10 corresponding to the keys used for keyboards are implemented on the keyboard.

Rather than simply registering when first switch portion 11 and the second switch portion 12 shown in FIGS. 2 and 3 contact each other a key switch can be created and connected to sensors in a manner that will permit registering of information during the entire activity of a key press. This is accomplished by taking the principles discussed above with respect to the row conductors and column conductors and incorporating the ability of taking measurements of the received signals to determine information into a PCB board and key board arrangement.

Figure 4:
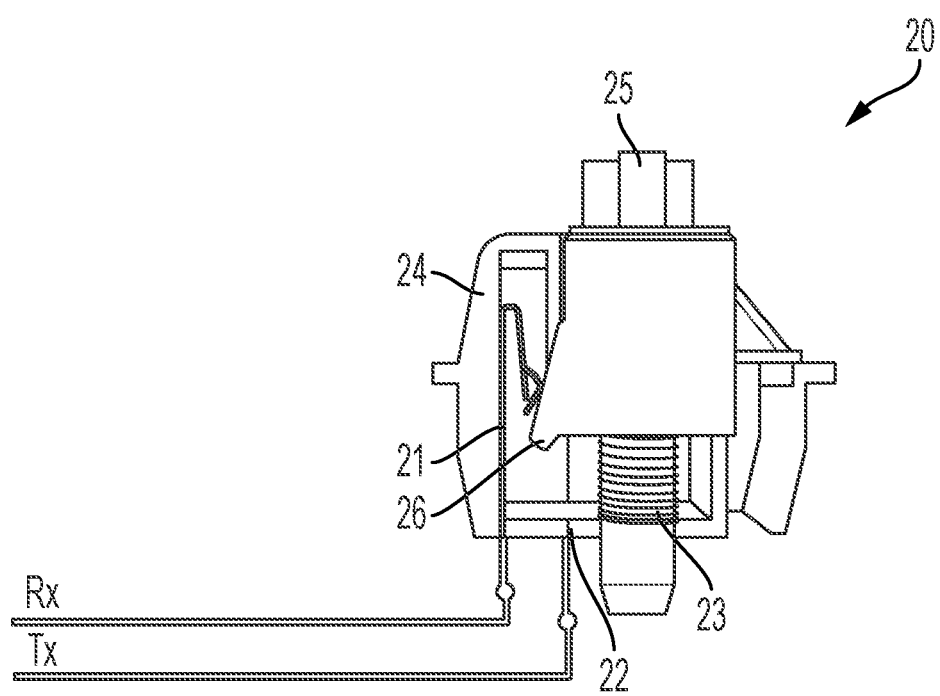
FIG. 4 shows a key switch having a receiver switch and a transmitter switch.
Figure 5:
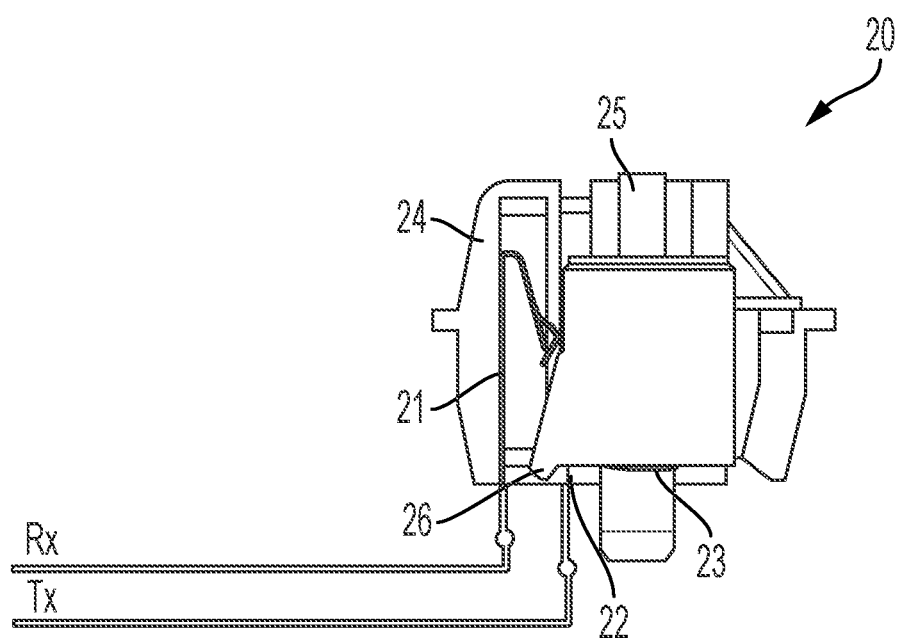
FIG. 5 shows the key switch of FIG. 4 in a depressed state.

Turning to FIGS. 4 and 5, shown is a key switch 20 that is made in accordance with an embodiment of the invention. The key switch 20 is typically one of many key switches 20 that are used on a keyboard. The key switch 20 has a stem 25 that is located within a housing 24. Typically when placed on a keyboard, the stem 25 will have a cap cover (not shown) placed over it. The cap cover will have placed thereon the letter, number or symbol indicia to indicate what type of key it is supposed to represent.

A receiving switch conductor 21 and a transmitting switch conductor 22 are located within the housing 24. The transmitting switch conductor 22 is operably connected to a signal generator and is able to transmit a signal. In an embodiment, the signal that is transmitted is frequency orthogonal to each other signal transmitted on the keyboard. The receiving switch conductor 21 is operably connected to a receiver and signal processor. Signals received on the receiving switch conductor 21 are measured and used to determine information regarding the depression of a key switch, the approach of finger or the removal of the finger from the key switch 20.

In the embodiment shown in FIGS. 4 and 5 a pair of conductors comprising the receiving switch conductor 21 and the transmitting switch conductor 22 are shown. In an embodiment, there is one receiving switch conductor per a key switch. In an embodiment, there is more than one transmitting switch conductor per a key switch. In an embodiment, there is more than one transmitting switch conductor per a key switch with each of the transmitting switch conductors adapted to transmit a signal frequency orthogonal to the signal transmitted by each other transmitting switch conductor. In an embodiment, there is more than one receiving switch conductor and more than one transmitting switch conductor per a key switch.

A spring 23 is operably connected to the stem 25. The spring provides resistance for the stem and restores the positioning of the key switch 20 when not depressed. Additionally, extending from the stem 25 is a switch projection 26 that is adapted to separate the transmitting switch conductor 22 from the receiving switch conductor 21 when in a non-depressed state. The switch projection 26 shown in FIGS. 4 and 5 is a sloped projection that extends downward towards the based of bottom of the housing 24.

The stem 25 and the housing 24 are situated so that the stem 25 partially extends from the housing 24 during a non-depressed state. The stem 25 is located in this default state due to the biasing of spring 23. The spring 23 is operably connected to the stem 25. During depression of the stem 25, the movement of the stem 25 compresses the spring 23. Cessation of depression of the stem 25 will permit the stem 25 to return to its non-depressed state due to the biasing force of the spring 23. In an embodiment, instead of a spring the inherent material properties of a key can be used to restore the key to its original state. In an embodiment, elastic materials are used to return the key to its original state. In an embodiment, magnetic forces are used to restore the key to its original state.

In the non-depressed state the receiving switch conductor 21 and the transmitting switch conductor 22 are not contacting each other. The receiving switch conductor 21 is operably connected to a receiver electrode 31 (shown in FIG. 6). The transmitting switch conductor 22 is operably connected to the transmitter electrode 32 (shown in FIG. 6). While the receiving switch conductor 21 and the transmitting switch conductor 22 are not contacting each other, the transmitting switch conductor 22 and the receiving switch conductor 21 are still capable of transmission and receipt of signals. The transmitting switch conductor 22 will transmit signals and the transmission of signals are able to be received at the receiving switch conductor 21. In operation, as the transmitting switch conductor 22 is depressed the movement of the transmitting switch conductor 22 can be determined based on measurements of signals received by the receiving conductor switch.

Figure 6:
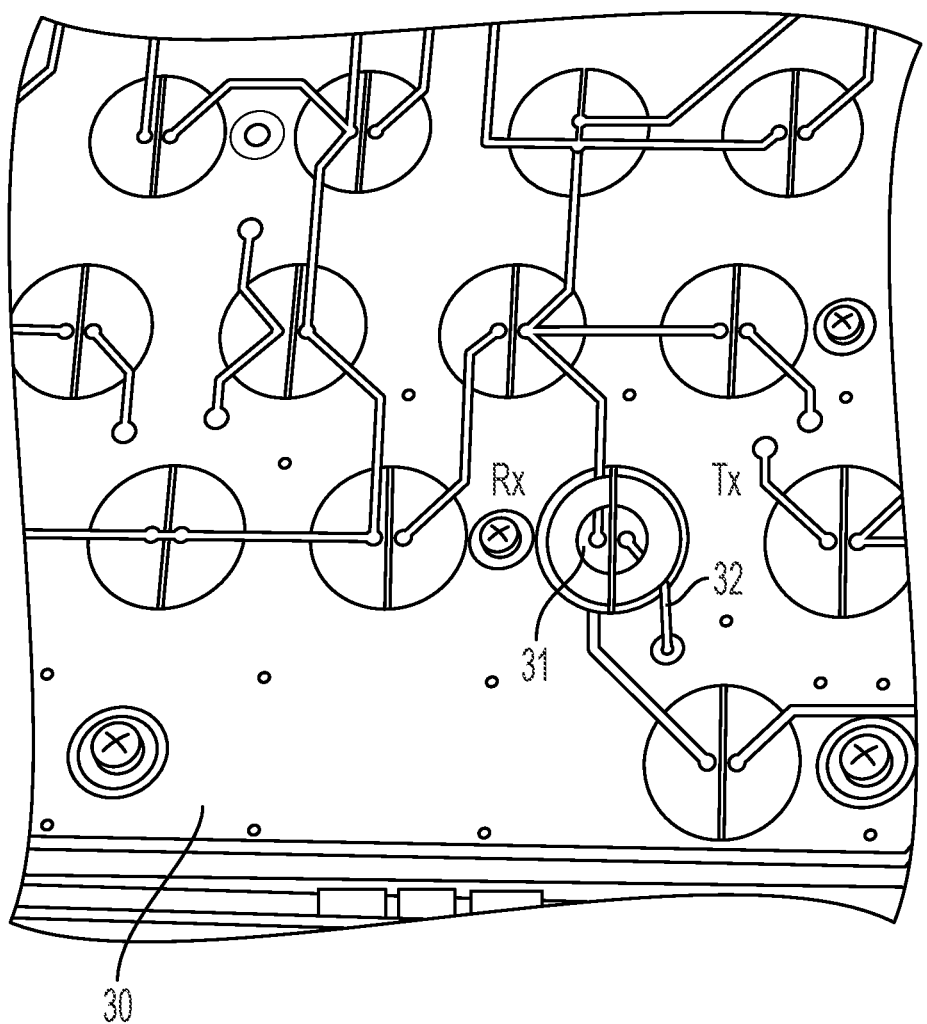
FIG. 6 shows a printed circuit board used in conjunction with the key switch shown in FIGS. 4 and 5.

In an embodiment, the roles of the transmitting switch conductor 22 and the receiving switch conductor 21 are reversed (i.e. the receiving switch conductor 21 is connected to the transmitter electrode 32 (shown in FIG. 6) and the transmitting switch conductor 22 is operably connected to the receiver electrode 31 (shown in FIG. 6). In an embodiment, the transmitting switch conductor 22 is operably connected to more than one transmitter electrode. In an embodiment the receiving switch conductor 21 is connected to more than one receiver electrode. In an embodiment both the receiving switch conductor 21 and the transmitting switch conductor 22 are connected to more than one receiver electrode and/or transmitter electrode. In an embodiment the receiving switch conductor 21 changes between being connected to a receiver electrode and a transmitter electrode. In an embodiment the transmitting switch conductor 22 varies between being connected to a receiver electrode and a transmitter electrode.

Still referring to FIGS. 4 and 5, the receiving switch conductor 21 is located within the housing 24 so that it remains in a stable position. The receiving switch conductor 21 is biased so that without pressure on it a portion of it will be biased towards the center of the housing 24. The switch projection 26 extends at an angle with respect to the stem 25. The switch projection 26 presses against the receiving switch conductor 21 so that the receiving conductor switch 21 is biased against the sloped projection 26 during the non-depressed state of the stem 25. The angle at which the sloped projection 26 is sloped controls the timing of when receiving switch conductor 21 comes into contact with the transmitting switch conductor 22. In the embodiment shown in FIGS. 4 and 5, the sloped projection is sized and sloped so that the transmitting switch conductor 22 and the receiving switch conductor 21 only come into contact with each other when the key switch 20 is fully depressed.

As the stem 25 is depressed the biasing of the receiving switch conductor 21 will cause it to move towards the center of the housing 24 and up the slope of the projection 26. When the stem 25 is fully depressed, the receiving switch conductor 21 fully engages the transmitting switch conductor 21. The contact of the receiving switch conductor 21 with the transmitting switch conductor 21 is registered as a significant touch event. When the stem 25 is not depressed the spring 23 will bias the stem 25 upwards again. The approach of (and departure from) the receiving switch conductor 21 with respect to the transmitting switch conductor 22 is detectable due to the transmission of signals from the transmitting switch conductor 22. The signals are received by the receiving switch conductor 21 and measured received signals are analyzed by a processor within the system. This creates a measurable quantity that can be evaluated and used to extract data regarding the position and movement of the key switch 20 throughout the entirety of its activation.

Tuning to FIG. 6, the key switch is mounted on PCB 30, as shown in FIG. 6, that has located thereon a plurality of receiver electrodes 31 and transmitter electrodes 32. These receiver electrodes 31 and transmitter electrodes 32 are operably connected to the receiving switch conductor 21 (shown in FIGS. 4 and 5) and the transmitting switch conductor 22 (shown in FIGS. 4 and 5). In an embodiment there are a plurality of columns of receiver electrodes and a plurality of rows of transmitter electrodes. In an embodiment there are six rows of transmitter electrodes by twenty columns of receiver electrodes. In an embodiment, there are 104 keys with the remainder of the receiver electrodes and transmitter electrodes used for other activities besides the sensing of key presses and determination of touch events. For example, receiver electrodes and transmitter electrodes are used for mouse tracking.

During operation of the key switch 20 shown in FIGS. 4 and 5, as the stem 25 is depressed and the receiving switch conductor 21 and the transmitting switch conductor 22 approach each other signal is transmitted via the transmitting switch conductor 22. At least some of the transmitted signal may be received at the receiving switch conductor 21. Signal received by the receiving switch conductor 21 is measured. By measuring the change in the magnitude or the phase of the received signal, the extent to which the stem 25 had been depressed can be determined. Full depression of the stem 25 can be ascertained when there is full contact between the transmitting switch conductor 22 and the receiving switch conductor 21.

Being able to measure slight changes in the amount the stem 25 is depressed (or non-depressed) can be used in assigning various functionality to the key switch 20. Furthermore, the position of a user's finger with respect to the key switch 20 can be ascertained at any point. The position of the user's finger can be detected when approaching the key switch 20, when above the key switch 20, during depression of the key switch 20 and during release of the key switch 20. In an embodiment, the position of and proximity to various key switches on the keyboard are used to provide predictive determination of future keystrokes. This predictive nature can be used to decrease latency and increase responsiveness.

In an embodiment, when more than one key switch 20 is depressed a different functionality can occur as a result of the interaction with the keyboard. In an embodiment when more than one key switch 20 is depressed to different extents different functionality occurs as a result of the interaction with the keyboard. In an embodiment different functionality occurs from partial depressions of each key switch 20. In an embodiment different functionality occurs both during depression and when slowly releasing a key switch 20. In an embodiment different functionality occurs during slow release of a key switch 20. In an embodiment, release and depression speeds of each key switch 20 may be determined based on measurements of signals. In an embodiment the coupling caused by the approach of a finger to the transmitting switch conductor or receiving switch conductor is measured. In an embodiment predetermined sequences of key switch 20 activity are used to alter activity of transmitting switch conductors and receiving switch conductors. In an embodiment the position of the fingers over more than one key switch 20 is used to make predictive determinations about future key presses. In an embodiment more than one key press is detected simultaneously. In an embodiment, some key switches 20 are configured to predictively trigger activation of underlying software responses based on the movement of the approaching finger. For example, a gamer's character can predictively make a move (e.g., pull a trigger, etc.) based on the detection of an approaching finger.

In an embodiment, a hover distance of multiple centimeters can be determined using the transmitting switch conductors 22 and the receiving switch conductors 21. In an embodiment, touch of a key can be precisely determined using the key switch 20. In an embodiment mouse pad functionality can be employed in some areas of the keyboard. In an embodiment, peripherals, other than a mouse, are adapted to be used on some areas of the keyboard through the employment of the same PCB. In an embodiment, mouse pad functionality is implemented in the palm rest area of a gaming keyboard. In an embodiment, a USB pass through is implemented in the keyboard. In an embodiment, a USB hub is built into keyboard.

In an embodiment, a signal generator and transmitter are operatively connected to each of the rows of transmitting switch conductors and configured to generate and transmit each of a plurality of frequency-orthogonal signals. In an embodiment, a receiver and signal processor are associated with each receiving electrode switch and operatively connected thereto.

An aspect of the disclosure is a keyboard. The keyboard comprises a key switch, wherein the key switch comprises; a housing; a stem movably located within the housing; a projection extending from the stem; a receiving switch conductor located within the housing, wherein the receiving switch conductor is operably connected to a receiver and a signal processor; a transmitting switch conductor located within the housing, wherein the transmitting switch conductor is operably connected to a signal generator; and wherein depression of the stem causes the receiving switch conductor and the transmitting switch conductor switch to approach each other as the stem is depressed, wherein the approach of the receiving switch conductor to the transmitting switch conductor is determined based on signals received at the receiving switch conductor form the transmitting switch conductor.

Another aspect of the disclosure is a key switch. The key switch comprises a housing; a stem movably located within the housing; a projection extending from the stem; a receiving switch conductor located within the housing, wherein the receiving switch conductor is operably connected to a receiver and a signal processor; a transmitting switch conductor located within the housing, wherein the transmitting switch conductor is operably connected to a signal generator; and wherein depression of the stem causes the receiving switch conductor and the transmitting switch conductor switch to approach each other as the stem is depressed, wherein the approach of the receiving switch conductor to the transmitting switch conductor is determined based on signals received at the receiving switch conductor form the transmitting switch conductor.

Still yet another aspect of the disclosure is a method of detecting movement of a key switch. The method comprises activating a key switch switch, wherein the key switch comprises a housing; a stem movably located within the housing; a projection extending from the stem; a receiving switch conductor located within the housing, wherein the receiving switch conductor is operably connected to a receiver and a signal processor; a transmitting switch conductor located within the housing, wherein the transmitting switch conductor is operably connected to a signal generator; transmitting a signal from the transmitting switch conductor during a period of time; receiving the signal transmitted from the switch conductor; measuring the signal that is received; and determining depression of the stem based on processed measurements.

The several embodiments discussed above illustrate a variety of systems for detecting touch events, but are not intended to limit the scope of the claims. Other systems' capacitive keys to improve touch data will become apparent to persons of skill in the art in view of this disclosure, and are thus included within the scope of this disclosure.

While the invention has been particularly shown and described with reference to a preferred embodiment thereof, it will be understood by those skilled in the art that various changes in form and details may be made therein without departing from the spirit and scope of the invention.

The invention claimed is:

1. A keyboard comprising:
   a key switch comprising;
   a stem that moves in a an axial direction by a pressing force;
   a projection extending from and perpendicular to the stem;
   a spring biasing the stem in a first position;
   a receiving switch conductor operably connected to a receiver and signal processor;
   a transmitting switch conductor operably connected to a signal generator;
   while in the first position, the projection separates the receiving switch conductor and the transmitting switch conductor from each other, whereupon axial movement of the stem against the spring bias causes capacitive determination of position of the receiving switch conductor and the transmitting switch conductor with respect to each other as the separation created by the projection decrease until the key switch is fully depressed at which point there is contact between the receiving switch conductor and the transmitting switch conductor.

2. A key switch comprising:
   transmit switch conductor operably connected to a signal generator;
   receive switch conductor operably connected to a signal processor, the receive switch conductor and the transmit switch conductor being configured in a first position;
   a depressable stem configured to change a position of the receive switch conductor with respect to the transmit switch conductor from the first position as it is depressed;
   the signal processor being adapted to measure the change in position by processing signals capacitively coupled between the receive switch conductor and the transmit switch conductor;
   wherein a projection is a sloped projection that prevents contact of the receiving switch conductor with transmitting switch conductor when the key switch is in a non-depressed state; and
   wherein the projection prevents the receiving switch conductor from contacting the transmitting switch conductor until the key switch is fully depressed.

3. The key switch of claim 2, wherein the key switch further comprises a spring biasing the stem in a non-depressed direction.

4. The key switch of claim 2, wherein the transmitting switch conductor transmits a signal that is frequency orthogonal to each other signal transmitted on a keyboard on where the key switch is located.

5. The key switch of claim 2, wherein movement speed of the key switch is determined based on signals received by the receiving switch conductor.

6. The key switch of claim 2, wherein the position of a finger above the key switch is determined based on the signals received by the receiving switch conductor.

7. A keyboard comprising:
   a key switch, wherein the key switch comprises;
   a depressable stem;
   a receiving switch conductor operably connected to a receiver and a signal processor;
   a transmitting switch conductor operably connected to a signal generator; and
   wherein depression of the stem causes capacitive determination of position of the receiving switch conductor and the transmitting switch conductor with respect to each other by processing signals received by the receiving switch conductor that are transmitted from the transmitting switch conductor;
   wherein a projection is a sloped projection that prevents contact of the receiving switch conductor with the transmitting switch conductor when the key switch is in a non-depressed state; and
   wherein the projection prevents the receiving switch conductor from contacting the transmitting switch conductor until the key switch is fully depressed.

8. The keyboard of claim 7, wherein the key switch further comprises a spring biasing the stem in a non-depressed direction.

9. The keyboard of claim 7, wherein the key switch is one of a plurality of key switches, wherein the transmitting switch conductor transmits a signal that is frequency orthogonal to each other signal transmitted by the keyboard.

10. The keyboard of claim 7, wherein movement speed of the key switch is determined based on signals received by the receiving switch conductor.

11. The keyboard of claim 7, wherein the position of a finger above the key switch is determined based on the signals received by the receiving switch conductor.

12. The keyboard of claim 7, wherein a portion of the keyboard is adapted for use with a peripheral computer device.

13. The keyboard of claim 7, wherein the keyboard is adapted to trigger response prior to a user's physical contact with the key switch.

14. The keyboard of claim 7, wherein the keyboard is adapted to trigger activities based on signals received by other receiving switch conductors on the keyboard.

* * * * *